(12) United States Patent
Inagaki et al.

(10) Patent No.: US 6,369,654 B1
(45) Date of Patent: Apr. 9, 2002

(54) SEMICONDUCTOR DEVICE

(75) Inventors: Yasuhiko Inagaki, Atsugi; Kyozo Makime, Isehara, both of (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/717,669

(22) Filed: Nov. 21, 2000

(30) Foreign Application Priority Data

Dec. 14, 1999  (JP) ............................................ 11-355043

(51) Int. Cl.[7] ................................................. H03F 1/08
(52) U.S. Cl. ........................ 330/293; 330/260; 257/537
(58) Field of Search ................................ 330/260, 291, 330/293, 307; 257/537, 538

(56) References Cited

U.S. PATENT DOCUMENTS

| | | | | |
|---|---|---|---|---|
| 5,204,636 A | * | 4/1993 | Werner, Jr. et al. | 330/260 |
| 5,489,547 A | * | 2/1996 | Erdeljac et al. | 257/350 |
| 5,805,023 A | * | 9/1998 | Fukuden | 330/293 |
| 6,023,091 A | * | 2/2000 | Koch et al. | 257/537 |

* cited by examiner

Primary Examiner—Robert Pascal
Assistant Examiner—Khanh V. Nguyen
(74) Attorney, Agent, or Firm—Ladas & Parry

(57) ABSTRACT

A semiconductor device includes a plurality of resistors each of which has a resistance that varies depending on voltage applied between contacts of the resistor. The semiconductor device includes a first resistor including a first resistive layer connected at a first contact to a first input wire and connected at a second contact to a first output wire, the first output wire having a first shielding portion which is connected to the second contact and shields the first resistive layer. A second resistor includes a second resistive layer connected at a third contact to a second input wire and connected at a fourth contact to a second output wire, the second output wire having a second shielding portion which is connected to the fourth contact and shields the second resistive layer. The first resistor and the second resistor are connected such that a potential difference of the first shielding portion of the first resistor from the first contact thereof and a potential difference of the second shielding portion of the second resistor from the third contact thereof are equal in polarity.

10 Claims, 7 Drawing Sheets

SEMICONDUCTOR DEVICE

BACKGROUND OF THE INVENTION

1. Field of the Invention

The present invention relates to a semiconductor device having resistive elements each of which is formed as a diffusion layer on an epitaxial layer of a semiconductor substrate.

2. Description of the Related Art

Semiconductor devices, such as bipolar integrated circuits, include resistive elements each of which is formed as a diffusion layer on an epitaxial layer of a semiconductor substrate. In the diffusion layer, doping elements are diffused into the semiconductor substrate.

FIG. 7A and FIG. 7B show a resistive element in a conventional semiconductor device. FIG. 7A is a cross-sectional view of the resistive element, and FIG. 7B is a top view of the resistive element.

As shown in FIG. 7A and FIG. 7B, in the conventional semiconductor device 1, an n-type epitaxial layer 4 is formed on a p-type silicon substrate 2 such that the epitaxial layer 4 is isolated by a (p+)-type isolation layer 3. By using a commonly known impurity doping process, various diffusion layers are formed on the epitaxial layer 4 to provide various circuit elements, such as resistors, transistors or diodes, on the silicon chip.

In the conventional semiconductor device 1, as shown in FIG. 7A and FIG. 7B, a p-type base diffusion layer 5 is provided on the n-type epitaxial layer 4 so that the resistive element is formed as the diffusion layer 5 on the epitaxial layer 4. At this location, a p-n junction between the diffusion layer 5 and the epitaxial layer 4 is formed, and the resistive element acts as a resistor having a resistance of the diffusion layer 5.

When the p-n junction between the diffusion layer 5 and the epitaxial layer 4 is connected to a forward-bias current source (not shown), the forward bias results in the movement of majority charge carriers (or electrons) into the opposing halves of the p-n junction. In this case, the electric potential of the diffusion layer 5 is higher than the electric potential of the epitaxial layer 4. A leaking current flows across the p-n junction.

In the resistive element of the above type, a bias voltage "Vbias" is initially applied to the epitaxial layer 4 of the p-n junction such that the electric potential of the epitaxial layer 4 is initially higher than the electric potential of the diffusion layer 5. As shown in FIG. 7A, an additional (n+)-type diffusion layer 6 is formed on the epitaxial layer 4, and one of a plurality of electrodes 8 is connected to the diffusion layer 6. The bias voltage Vbias is supplied to the epitaxial layer 4 of the p-n junction through the electrode 8 and the diffusion layer 6.

In the conventional semiconductor device 1, as shown in FIG. 7A, a dielectric layer 7 of silicon dioxide ($SiO_2$) and the electrodes 8 of aluminum (Al) are provided on the silicon substrate 2, and a protective layer 9 of silicon nitride ($SiN_2$) is formed thereon to cover the dielectric layer 7 and the electrodes 8.

In the resistive element of the conventional semiconductor device 1, the bias voltage Vbias, which is initially applied to the epitaxial layer 4, results in the reverse bias between the diffusion layer 5 and the epitaxial layer 4. The reverse bias may create the movement of the charge carriers away from the interface in the p-n junction, and an insulating zone forms. In such a case, the voltage dependence of the resistive element on the base diffusion layer 5 will be developed due to the insulating zone in the p-n junction. Namely, the resistance of the resistive element considerably varies when the voltage supplied to the epitaxial layer 4 of the resistive element is slightly changed.

The voltage dependence of the resistive element will be detrimental to the operational characteristics of the semiconductor device, and such is true of a case in which the resistive element is formed as a feedback resistor in an inverting amplifier device.

SUMMARY OF THE INVENTION

In order to overcome the above-described problems, preferred embodiments of the present invention provide a semiconductor device in which resistive elements are connected to effectively prevent the variation of the operational characteristics of the semiconductor device regardless of whether the applied voltage between contacts of each resistive element varies.

According to one preferred embodiment of the present invention, a semiconductor device having a plurality of resistors each having a resistance that varies depending on voltage applied between contacts of the resistor, comprises: a first resistor which includes a first resistive layer connected at a first contact to a first input wire and connected at a second contact to a first output wire, the first output wire having a first shielding portion which is connected to the second contact and shields the first resistive layer; and a second resistor which includes a second resistive layer connected at a third contact to a second input wire and connected at a fourth contact to a second output wire, the second output wire having a second shielding portion which is connected to the fourth contact and shields the second resistive layer, wherein the first resistor and the second resistor are connected such that a potential difference of the first shielding portion of the first resistor from the first contact thereof and a potential difference of the second shielding portion of the second resistor from the third contact thereof are equal in polarity.

In the semiconductor device of the above preferred embodiment, the first resistor and the second resistor are connected such that the polarity of the first shielding portion of the first resistor at the second contact matches with the polarity of the second shielding portion of the second resistor at the fourth contact. For example, when the polarity of the applied voltage between the contacts of the first resistor is positive, the polarity of the applied voltage between the contacts of the second resistor is also positive. The semiconductor device of the above preferred embodiment includes the first and second resistors which are connected as described above, and it is possible to keep the resistance ratio of the first and second resistors constant regardless of whether the applied voltage varies.

Therefore, the semiconductor device of the present invention is effective in preventing the variation of the operational characteristics of the semiconductor device regardless of whether the applied voltage varies. In a case in which the semiconductor device is formed as an amplifier device including an operational amplifier, it is possible to effectively prevent the variation of the amplification degree of the amplifier device regardless of whether the applied voltage between the contacts of each resistor varies. It is possible to improve the linearity and the distortion characteristics of the amplifier device.

BRIEF DESCRIPTION OF THE DRAWINGS

Other objects, features and advantages of the present invention will become apparent from the following detailed description when read in conjunction with the accompanying drawings.

DETAILED DESCRIPTION OF PREFERRED EMBODIMENTS

A description will now be provided of preferred embodiments of the present invention with reference to the accompanying drawings.

Figure 1:
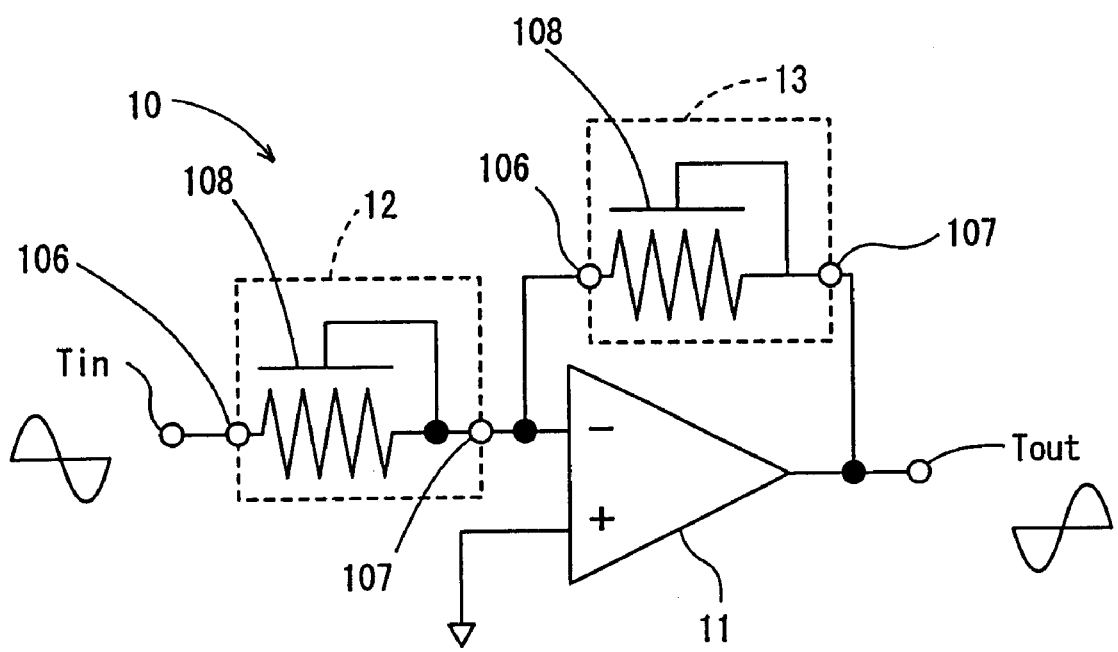
FIG. 1 is a circuit diagram of a first preferred embodiment of the semiconductor device of the invention.

FIG. 1 shows a first preferred embodiment of the semiconductor device of the invention. The semiconductor device of the present embodiment is, as shown in FIG. 1, an inverting amplifier device 10 using an operational amplifier.

In the inverting amplifier device 10 of FIG. 1, an operational amplifier 11, an input resistor 12 and a feedback resistor 13 are provided. These circuit elements are integrally formed on a semiconductor substrate.

As shown in FIG. 1, the inverting amplifier device 10 has an input terminal "Tin" and an output terminal "Tout". The input resistor 11 is connected at one end to the input terminal "Tin", and connected at the other end to an inverting input of the operational amplifier 11. An input signal is sent from the input terminal "Tin" through the input resistor 12 to the inverting input "−" of the operational amplifier 11. The input signal is subjected to inversion and amplification of the inverting amplifier device 10 so that an output signal is produced at the output of the inverting amplifier device 10. The feedback resistor 13 is connected at one end to the inverting input "−" of the operational amplifier 11 and connected at the other end to the output terminal "Tout". A non-inverting input "+" of the operational amplifier 11 is grounded. As shown in FIG. 1, the phase of the input signal, which is delivered from the input terminal "Tin" to the operational amplifier 11, is inverted to a 180-degree shifted phase, and the output signal, delivered from the output of the operational amplifier 11 to the output terminal "Tout", has such inverted phase.

Both the input resistor 12 and the feedback resistor 13 in the inverting amplifier device 10 are a resistive element containing polysilicon. In other words, each of the input resistor 12 and the feedback resistor 13 in the inverting amplifier device 10 is formed as a resistive layer on an epitaxial layer of a silicon substrate.

Figure 2A:
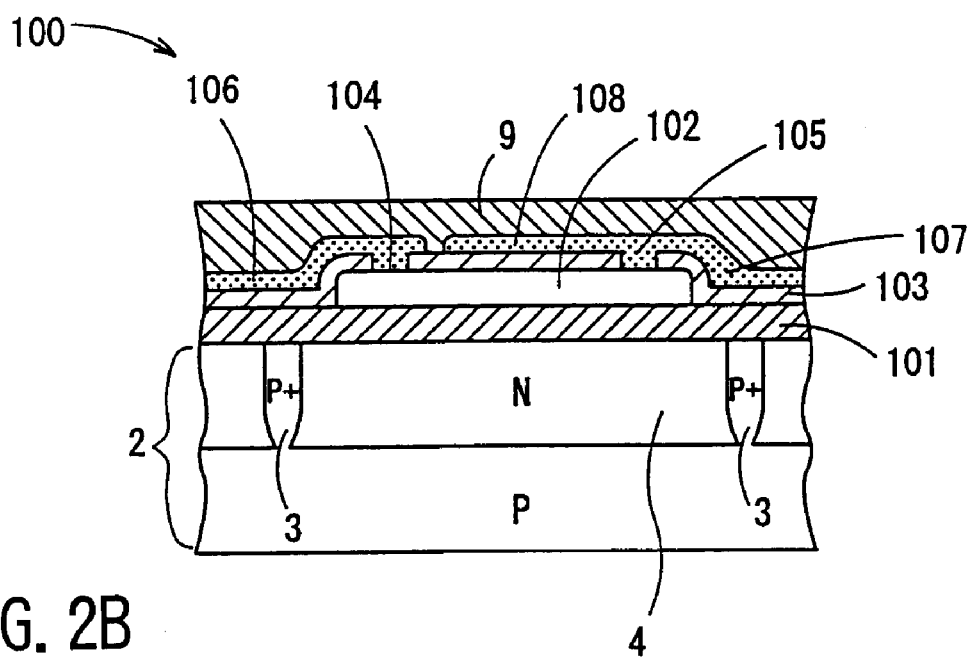
FIG. 2A and FIG. 2B are a cross-sectional view and a top view of one of resistive elements in the semiconductor device of the first preferred embodiment.
Figure 2B:
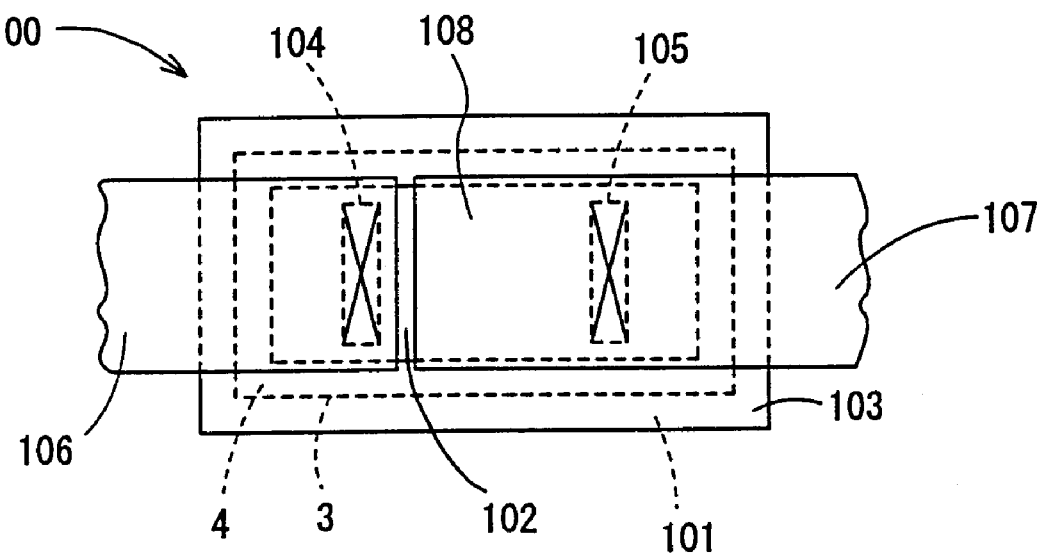
Figure 7A:
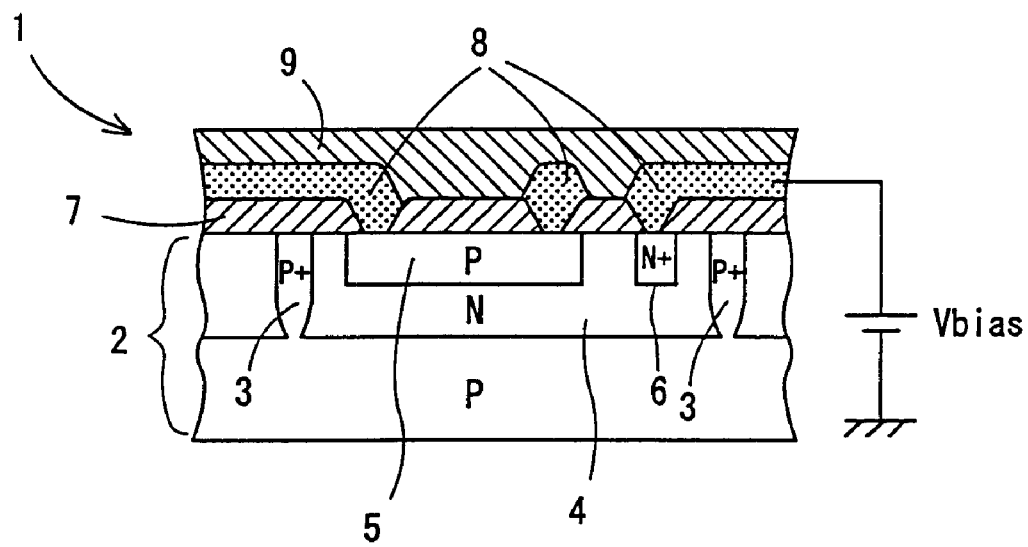
FIG. 7A and FIG. 7B are a cross-sectional view and a top view of a resistive element in a conventional semiconductor device.
Figure 7B:
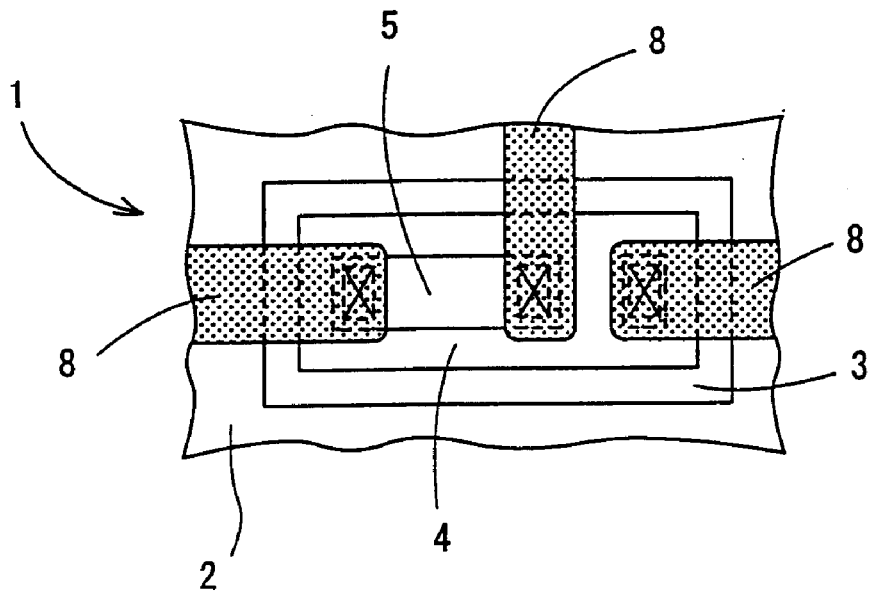

FIG. 2A and FIG. 2B are a cross-sectional view and a top view of one of the resistive elements in the semiconductor device of the first preferred embodiment. In FIG. 2A and FIG. 2B, the elements which are essentially the same as corresponding elements in FIG. 7A and FIG. 7B are designated by the same reference numerals, and a description thereof will be omitted.

As shown in FIG. 2A and FIG. 2B, in the resistive element 100, the n-type epitaxial layer 4 is formed on the silicon substrate 2 such that the epitaxial layer 4 is isolated by the (p+)-type isolation layer 3. In the present embodiment, a dielectric layer 101 of silicon dioxide or the like is formed on the substrate 2, and a resistive layer 102 is further formed on the dielectric layer 101. Alternatively, the resistive layer 102 may be formed on the isolation layer 3 through the dielectric layer 101.

The resistive layer 102 is made of, for example, a polysilicon resistive material or a metallic resistive material. The polysilicon resistive material is commonly used as the material of gates in CMOS (complementary metal oxide semiconductor) integrated circuits. The resistive layer 102 is formed through the known CMOS process by using the polysilicon resistive material. Generally, the polysilicon resistive material has a relatively small resistance. When a large resistance is needed for the resistive layer 102, it is necessary to control the amount of impurities mixed with the polysilicon resistive material. The material of the resistive layer 102 according to the present invention is not limited to the polysilicon resistive material.

In the resistive element 100 of the present embodiment, as shown in FIG. 2A and FIG. 2B, a dielectric layer 103 of silicon dioxide or the like is formed on the resistive layer 102. In the dielectric layer 103, a first contact 104 and a second contact 105 are formed at end portions on the upper surface of the resistive layer 102 by using a conductive material, such as aluminum. Further, an input/output wire 106 and an input/output wire 107 are formed on the dielectric layer 103 by using a conductive material, such as aluminum.

The wire 106 is connected to the resistive layer 102 at the contact 104 provided in the dielectric layer 103. The wire 107 is connected to the resistive layer 102 at the contact 105 provided in the dielectric layer 103.

The wire 107, which is provided above the contact 105, includes a shielding portion 108 that extends over more than half the resistive layer 102, not only above the contact 105. The shielding portion 108 is connected to the contact 105 and shields the resistive layer 102 through the dielectric layer 103. The protective layer 9 is formed on the wire 106 and the wire 107.

In the resistive element 100 of the present embodiment, the epitaxial layer 4 is formed on the silicon substrate 2 such that the epitaxial layer 4 is isolated by the isolation layer 3, and the resistive layer 102 is formed on the epitaxial layer 4 via the dielectric layer 101. In the present embodiment, the bias voltage, as in the resistive element of the conventional semiconductor device 1, is not applied to the epitaxial layer 4. The diffusion layer 6 and the electrodes 8, as in the conventional semiconductor device 1, are no longer needed, and what is required for the resistive element 100 is that the input/output wires 106 and 107 are placed so that they are connected to the resistive layer 102 at the contacts 104 and 105. The resistive element 100 of the present embodiment is effective in providing a simplified wire bonding and a smaller-size semiconductor device.

In the inverting amplifier device 10 of FIG. 1, the input resistor 12 is connected such that the wire 106 of the resistive element 100 is coupled to the input terminal "Tin" and the wire 107 is coupled to the inverting input "−" of the operational amplifier 11. The feedback resistor 13 is connected such that the wire 106 of the resistive element 100 is coupled to the inverting input "−" of the operational amplifier 11 and the wire 107 is coupled to the output terminal "Tout". Such configuration of the input resistor 12 and the feedback resistor 13 is effective in preventing the variation of the amplification degree of the inverting amplifier device 10 which results from the voltage dependence of the resistance of the resistive element 100 for each of the input resistor 12 and the feedback resistor 13.

Figure 3:
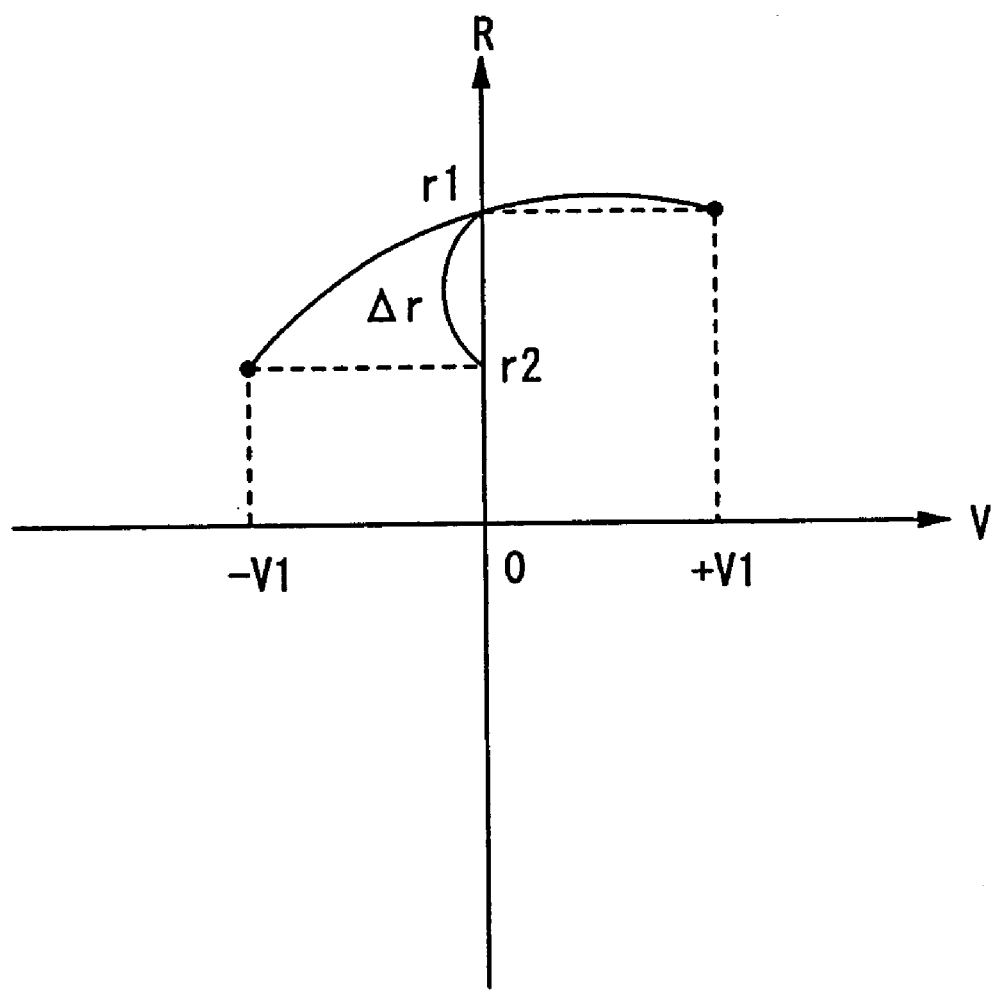
FIG. 3 is a diagram for explaining a voltage dependence of the resistive element in the first preferred embodiment.

Next, a description will be provided of the voltage dependence of the resistance of the resistive element 100. FIG. 3 shows a voltage dependence of the resistance of the resistive element 100 in the first preferred embodiment.

As indicated by the curve in FIG. 3, the resistive element 100 has a first resistance "r1" when a voltage "+V1" is applied, and has a second resistance "r2" when a voltage "−V1" is applied. The polarity of the applied voltage between the contacts 104 and 105 of the resistive element 100 is positive when the electric potential of the wire 106 is higher than the electric potential of the wire 107, and it is negative when the electric potential of the wire 107 is higher than the electric potential of the wire 106. The resistance of the resistive element 100 for the applied voltage "+V1" differs from that for the applied voltage "−V1" by the amount of a difference Δr (=r1−r2) between the first resistance r1 and the second resistance r2.

The amplification degree of the inverting amplifier device 10 varies depending on a ratio of the resistance of the input resistor 12 to the resistance of the feedback resistor 13. If the resistance ratio of the input resistor 12 and the feedback resistor 13 varies, the amplification degree of the inverting amplifier device 10 varies accordingly. Hence, the voltage dependence of the resistive element for each of the resistors 12 and 13 will be detrimental to keeping the operational characteristics of the inverting amplifier device 10 constant.

In order to prevent the variation of the amplification degree of the inverting amplifier device 10, it is necessary to keep the resistance ratio of the input resistor 12 and the feedback resistor 13 invariably constant regardless of whether the applied voltage between the contacts of each resistor varies. For this purpose, in the inverting amplifier device 10 of FIG. 1, the input resistor 12 and the feedback resistor 13 are connected such that the potential difference of the shielding portion 108 of the input resistor 12 from the input-side contact 104 thereof and the potential difference of the shielding portion 108 of the feedback resistor 13 from the input-side contact 104 thereof are equal in polarity. In other words, the input resistor 12 and the feedback resistor 13 are connected such that the polarity of the shielding portion 108 of the input resistor 12 at the output-side contact 105 thereof matches with the polarity of the shielding portion 108 of the feedback resistor 13 at the output-side contact 105 thereof.

For example, in the inverting amplifier device 10 of the present embodiment, when the polarity of the applied voltage between the contacts of the input resistor 12 is positive, the polarity of the applied voltage between the contacts of the feedback resistor 13 is also positive. The inverting amplifier device 10 of the present embodiment has the input resistor 12 and the feedback resistor 13, which are connected as described above, and it is possible to keep the resistance ratio of the input resistor 12 and the feedback resistor 13 constant regardless of whether the applied voltage varies.

Therefore, the semiconductor device of the present embodiment is effective in preventing the variation of the operational characteristics of the semiconductor device regardless of whether the applied voltage varies. Namely, the inverting amplifier device 10 can effectively prevent the variation of the amplification degree of the inverting amplifier device 10 regardless of whether the applied voltage between the contacts of each resistor varies. It is possible to improve the linearity and the distortion characteristics of the inverting amplifier device 10.

In the above embodiment of FIG. 1, the shielding portion 108 of the input resistor 12 is connected to the inverting input of the operational amplifier 11, and the shielding portion 108 of the feedback resistor 13 is connected to the output terminal "Tout". The semiconductor device of the present invention is not limited to this embodiment. Alternatively, the shielding portion 108 of the input resistor 12 may be connected to the input terminal "Tin", and the shielding portion 108 of the feedback resistor 13 may be connected to the inverting input of the operational amplifier 11. In such alternative embodiment, the advantageous features of the invention that are the same as those of the above embodiment of FIG. 1 can be achieved.

Figure 4:
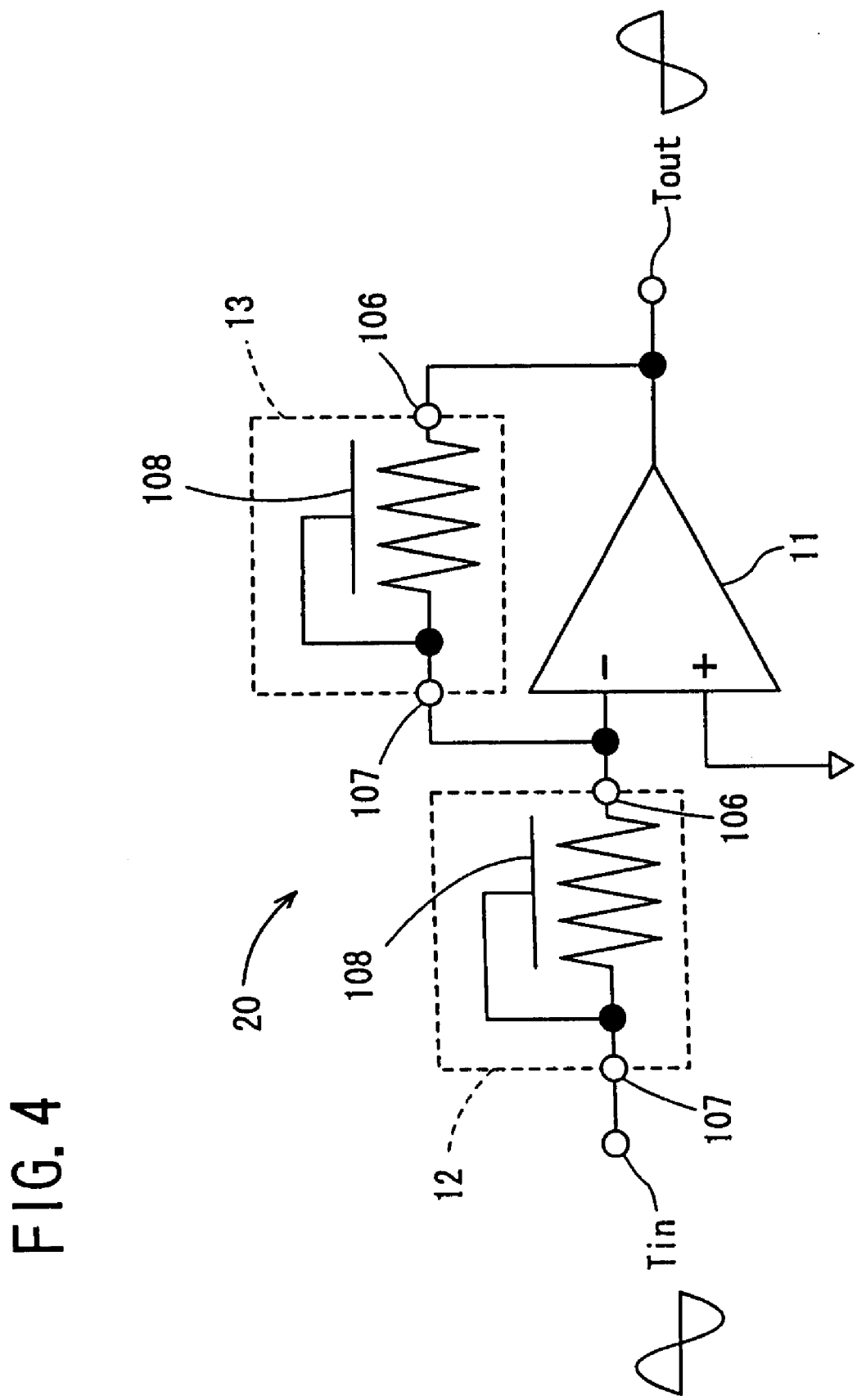
FIG. 4 is a circuit diagram of a second preferred embodiment of the semiconductor device of the invention.

FIG. 4 shows a second preferred embodiment of the semiconductor device of the invention. In FIG. 4, the elements which are essentially the same as corresponding elements in FIG. 1 are designated by the same reference numerals, and a description thereof will be omitted.

As shown in FIG. 4, the semiconductor device of the present embodiment is an inverting amplifier device 20 using an operational amplifier. The inverting amplifier device 20 has the operational amplifier 11, the input resistor 12 and the feedback resistor 13. Unlike the previous embodiment of FIG. 1, in the inverting amplifier device 20 of the present embodiment, the shielding portion 108 of the input resistor 12 is connected to the input terminal "Tin", and the shielding portion 108 of the feedback resistor 13 is connected to the inverting input of the operational amplifier 11. This is simply achieved by reversing the wire 106 and the wire 107 of each resistive element. Namely, the wire 107 of the input resistor 12 is connected to the input terminal "Tin" and the wire 106 thereof is connected to the inverting input of the operational amplifier 11, while the wire 107 of the feedback resistor 13 is connected to the inverting input of the operational amplifier 11 and the wire 106 thereof is connected to the output terminal "Tout".

In the present embodiment, the advantageous features of the present invention that are the same as those of the previous embodiment of FIG. 1 can be achieved. Namely, in the inverting amplifier device 20 of FIG. 4, the input resistor 12 and the feedback resistor 13 are connected such that the potential difference between the contacts of the input resistor 12 is essentially the same as the potential difference between the contacts of the feedback resistor 13.

For example, in the inverting amplifier device 20 of the present embodiment, when the polarity of the applied voltage between the contacts of the input resistor 12 is positive, the polarity of the applied voltage between the contacts of the feedback resistor 13 is also positive. The inverting amplifier device 20 of the present embodiment has the input resistor 12 and the feedback resistor 13, which are connected as described above, and it is possible to keep the resistance ratio of the input resistor 12 and the feedback resistor 13 constant regardless of whether the applied voltage varies.

Therefore, the semiconductor device of the present embodiment is effective in preventing the variation of the operational characteristics of the semiconductor device regardless of whether the applied voltage varies. Namely, the inverting amplifier device 20 can effectively prevent the variation of the amplification degree of the inverting amplifier device 20 regardless of whether the applied voltage between the contacts of each resistor varies. It is possible to improve the linearity and the distortion characteristics of the inverting amplifier device 20.

In the above-described embodiments, the semiconductor device of the present invention is applied to an inverting amplifier device. Similarly, the semiconductor device of the present invention is also applicable to a non-inverting amplifier device, which will be described below.

Figure 5:
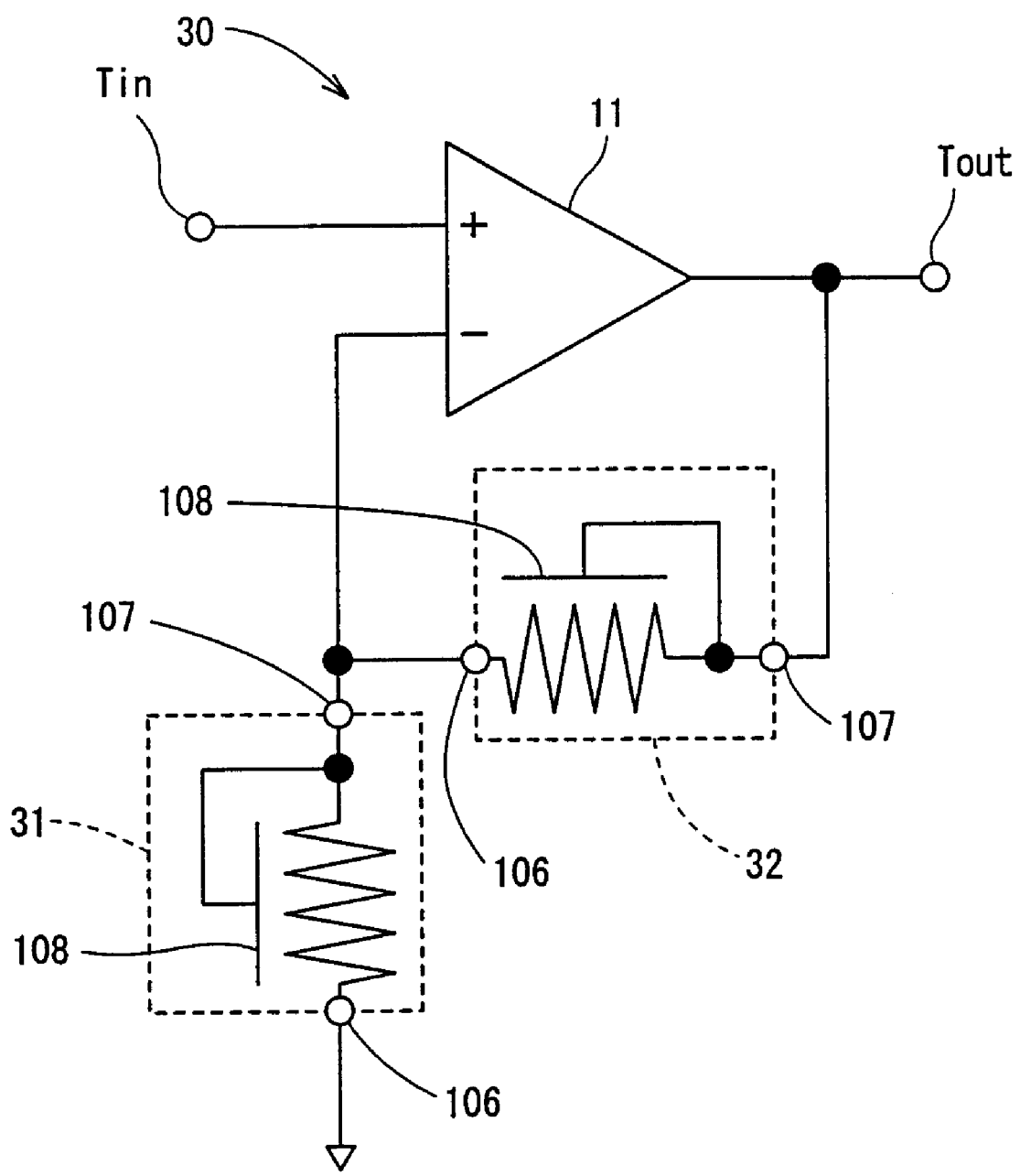
FIG. 5 is a circuit diagram of a third preferred embodiment of the semiconductor device of the invention.

Next, FIG. 5 shows a third preferred embodiment of the semiconductor device of the invention. In FIG. 5, the elements which are essentially the same as corresponding elements in FIG. 1 are designated by the same reference numerals, and a description thereof will be omitted.

As shown in FIG. 5, the semiconductor device of the present embodiment is a non-inverting amplifier device 30 using an operational amplifier. The non-inverting amplifier device 30 has the operational amplifier 11, a first resistor 31 and a second resistor 32. Each of the first and second resistors 31 and 32 is formed as the resistive element that is essentially the same as the resistive element 100 shown in FIG. 2A and FIG. 2B.

In the non-inverting amplifier device 30 of the present embodiment, the wire 106 of the first resistor 31 is grounded, and the wire 107 of the first resistor 31 is connected to the inverting input of the operational amplifier 11. The wire 106 of the second resistor 32 is connected to the inverting input of the operational amplifier 11, and the wire 107 of the second resistor 32 is connected to the output terminal "Tout". The operational amplifier 11 has the non-inverting input connected to the input terminal "Tin", and has the output connected to the output terminal "Tout".

Further, in the non-inverting amplifier device 30 of FIG. 5, the shielding portion 108 of the first resistor 31 is connected to the inverting input of the operational amplifier 11, and the shielding portion 108 of the second resistor 32 is connected to the output terminal "Tout". In the present embodiment, the first and second resistors 31 and 32 are connected in series between the ground and the output terminal "Tout". Regardless of whether the output voltage of the operational amplifier 11 varies, the potential difference between the contacts of the first resistor 31 is essentially the same as the potential difference between the contacts of the second resistor 32.

In the above-described embodiments, the amplifier devices 10, 20 and 30 are configured to have a one-fold amplification factor. Alternatively, the semiconductor device according to the present invention may be configured to have a multiple-fold amplification factor, which will be described below.

Figure 6:
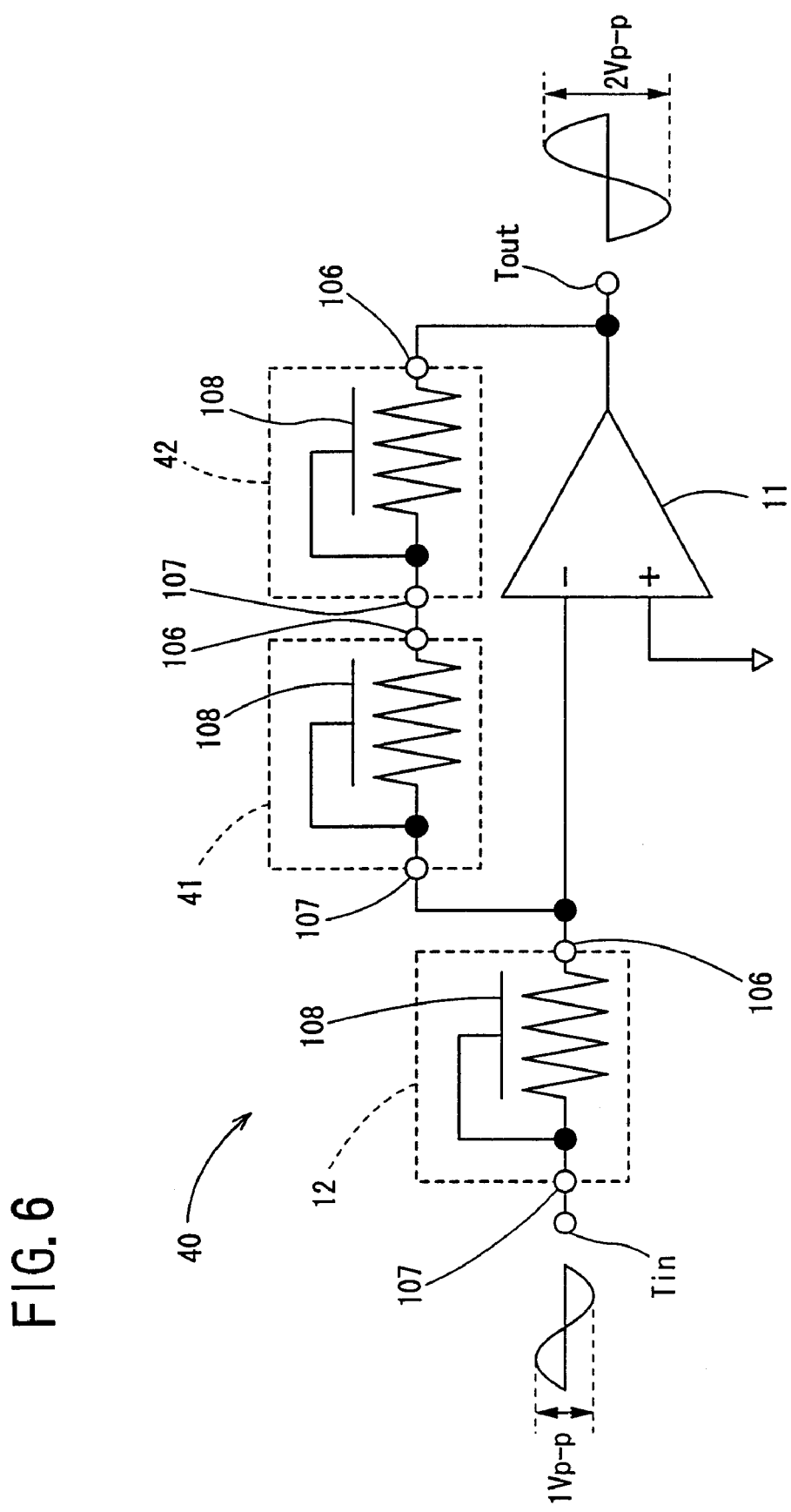
FIG. 6 is a circuit diagram of a fourth preferred embodiment of the semiconductor device of the invention.

FIG. 6 show a fourth preferred embodiment of the semiconductor device of the invention. In FIG. 6, the elements which are essentially the same as corresponding elements in FIG. 1 are designated by the same reference numerals, and a description thereof will be omitted.

As shown in FIG. 6, the semiconductor device of the present embodiment is an inverting amplifier device 40 having a two-fold amplification factor. When the voltage of an input signal to the inverting amplifier device 40 is represented by "1Vp-p", the voltage of an output signal from the inverting amplifier device 40 is represented by "2Vp-p". The phase of the input signal is inverted to a 180-degree shifted phase, and the output signal of the inverting amplifier device 40 has such inverted phase.

The inverting amplifier device 40 has the operational amplifier 11, the input resistor 12, a first feedback resistor 41 and a second feedback resistor 42. Each of the first and second feedback resistors 41 and 42 is formed as the resistive element that is essentially the same as the resistive element 100 shown in FIG. 2A and FIG. 2B. The first and second feedback resistors 41 and 42 are of equal resistance, and they are connected in series between the inverting input of the operational amplifier 11 and the output thereof.

In the inverting amplifier device 40 of the present embodiment, the wire 106 of the first feedback resistor 41 is connected to the wire 107 of the second feedback resistor 42, and the wire 107 of the first feedback resistor 41 is connected to the inverting input of the operational amplifier 11. The wire 106 of the second feedback resistor 42 is connected to the output terminal "Tout", and the wire 107 of the second feedback resistor 42 is connected to the wire 106 of the first feedback resistor 41. The operational amplifier 11 has the non-inverting input grounded, and has the output connected to the output terminal "Tout".

Further, in the inverting amplifier device 40 of FIG. 6, the shielding portion 108 of the first feedback resistor 41 is connected to the inverting input of the operational amplifier 11, and the shielding portion 108 of the second feedback resistor 42 is connected to the contact point between the two resistors 41 and 42. In the present embodiment, the first and second feedback resistors 41 and 42 are connected in series between the ground and the output terminal "Tout". Regardless of whether the output voltage of the operational amplifier 11 varies, the potential difference between the contacts of the first feedback resistor 41 is essentially the same as the potential difference between the contacts of the second feedback resistor 42. As the first and second feedback resistors 41 and 42 are of equal resistance, the voltage applied between the contacts of the resistor 41 is substantially the same as the voltage applied between the contacts of the resistor 42.

In the above-described embodiment, the inverting amplifier device 40 has a two-fold amplification factor. Similarly, the semiconductor device according to the present invention may be configured to have an "n"-fold amplification factor by providing "n" feedback resistors which are connected in series and of equal resistance. Each of the "n" feedback resistors is formed as the resistive element that is essentially the same as the resistive element 100 shown in FIG. 2A and FIG. 2B.

In the above-described embodiment, the shielding portion 108 of the input resistor 12 is connected to the input terminal "Tin", and the shielding portion 108 of each of the feedback resistors 41 and 42 is connected to the output of the preceding resistor. Alternatively, the wire 106 and the wire 107 of each resistive element may be reversed in a manner similar to that of the embodiment of FIG. 1.

The present invention is not limited to the above-described embodiments, and variations and modifications may be made without departing from the scope of the present invention. For example, in the above-described embodiments, the semiconductor device according to the present invention is applied to inverting and non-inverting amplifier devices. The present invention is not limited to these embodiments. The semiconductor device according to the present invention may be applied to various semiconductor circuits including a plurality of resistive elements.

Further, the present invention is based on Japanese priority application No. 11-355043, filed on Dec. 14, 1999, the entire contents of which are hereby incorporated by reference.

What is claimed is:

1. A semiconductor device including a plurality of resistors each having a resistance that varies depending on voltage applied between contacts of the resistor, comprising:

a first resistor including a first resistive layer connected at a first contact to a first input wire and connected at a second contact to a first output wire, the first output wire having a first shielding portion which is connected to the second contact and shields the first resistive layer; and a second resistor including a second resistive layer connected at a third contact to a second input wire and connected at a fourth contact to a second output wire, the second output wire having a second shielding portion which is connected to the fourth contact and shields the second resistive layer, wherein the first resistor and the second resistor are connected such that a potential difference of the first shielding portion of the first resistor from the first contact thereof and a potential difference of the second shielding portion of the second resistor from the third contact thereof are equal in polarity.

2. The semiconductor device according to claim 1, wherein the first resistor and the second resistor are connected such that a voltage applied between the first input-side contact and the first output-side contact of the first resistor is substantially the same in magnitude as a voltage applied between the second input-side contact and the second output-side contact of the second resistor.

3. The semiconductor device according to claim 1, wherein the first resistor and the second resistor are of equal resistance, and the first resistor and the second resistor are connected such that a voltage applied between the first input-side contact and the first output-side contact of the first resistor is substantially the same in magnitude as a voltage applied between the second input-side contact and the second output-side contact of the second resistor.

4. The semiconductor device according to claim 1, wherein the semiconductor device includes an input terminal and an output terminal, and the first input wire of the first resistor is connected to the input terminal, the second output wire of the second resistor is connected to the output terminal, and the first output wire of the first resistor and the second input wire of the second resistor are connected together.

5. The semiconductor device according to claim 1, wherein the semiconductor device includes an input terminal and an output terminal, and the first output wire of the first resistor is connected to the input terminal, the second input wire of the second resistor is connected to the output terminal, and the first input wire of the first resistor and the second output wire of the second resistor are connected together.

6. The semiconductor device according to claim 1, wherein the semiconductor device is an inverting amplifier device including an operational amplifier connected to the plurality of resistors.

7. The semiconductor device according to claim 1, wherein the semiconductor device is a non-inverting amplifier device including an operational amplifier connected to the plurality of resistors.

8. The semiconductor device according to claim 1, wherein the semiconductor device is an amplifier device including an operational amplifier connected to the plurality of resistors, and the plurality of resistors include an input resistor and at least two feedback resistors, said at least two feedback resistors being connected in series between an inverting input of the operational amplifier and an output of the operational amplifier.

9. The semiconductor device according to claim 6, wherein the operational amplifier has an inverting input, a non-inverting input grounded, and an output connected to an output terminal, and both the first output wire of the first resistor and the second input wire of the second resistor are connected to the inverting input of the operational amplifier.

10. The semiconductor device according to claim 7, wherein the operational amplifier has an inverting input, a non-inverting input connected to an input terminal, and an output connected to an output terminal, and both the first output wire of the first resistor and the second input wire of the second resistor are connected to the inverting input of the operational amplifier.

* * * * *